(12) United States Patent
Cumbie et al.

(10) Patent No.: US 11,364,493 B2
(45) Date of Patent: Jun. 21, 2022

(54) PLANARIZATION LAYERS OVER SILICON DIES

(71) Applicant: HEWLETT-PACKARD DEVELOPMENT COMPANY, L.P., Spring, TX (US)

(72) Inventors: Michael W. Cumbie, Corvallis, OR (US); Chien-Hua Chen, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 180 days.

(21) Appl. No.: 16/645,042

(22) PCT Filed: Oct. 12, 2017

(86) PCT No.: PCT/US2017/056377
§ 371 (c)(1),
(2) Date: Mar. 6, 2020

(87) PCT Pub. No.: WO2019/074511
PCT Pub. Date: Apr. 18, 2019

(65) Prior Publication Data
US 2020/0282394 A1    Sep. 10, 2020

(51) Int. Cl.
*B01L 3/00* (2006.01)
*B81B 7/00* (2006.01)

(52) U.S. Cl.
CPC ... *B01L 3/502707* (2013.01); *B01L 3/502715* (2013.01); *B81B 7/0025* (2013.01); *B01L 2200/12* (2013.01); *B01L 2300/041* (2013.01); *B01L 2300/06* (2013.01); *B01L 2300/12* (2013.01); *B81B 2201/057* (2013.01); *B81B 2203/0338* (2013.01); *B81B 2207/07* (2013.01)

(58) Field of Classification Search
CPC ......... B01L 3/502715; B01L 3/502707; B01L 3/5027; B01L 3/502; B01L 3/50; B01L 2200/12; B01L 2300/041; B01L 2300/06; B81B 7/0025; B81B 2201/057; B81B 2203/0338; B81B 2207/07
USPC .................................................. 422/502, 500
See application file for complete search history.

(56) References Cited

U.S. PATENT DOCUMENTS

| 6,477,901 | B1 | 11/2002 | Tadigadapa |
| 6,821,819 | B1 | 11/2004 | Benavides |
| 7,216,660 | B2 | 5/2007 | Troian et al. |
| 7,446,382 | B2 | 11/2008 | Winer et al. |
| 8,975,193 | B2 | 3/2015 | Johnstone et al. |
| 9,266,331 | B2 | 2/2016 | Sakuma et al. |
| 9,340,410 | B2 * | 5/2016 | Ollier ............... B81B 7/0061 |

(Continued)

FOREIGN PATENT DOCUMENTS

EP    2404755    1/2012

OTHER PUBLICATIONS

Almanza-Workman, M.; "Planarization Coating for Polyimide Substrates Used in Roll-to-roll Fabrication of Active Matrix Backplanes for Flexible Displays"; Feb. 6, 2012.

*Primary Examiner* — Christine T Mui
(74) *Attorney, Agent, or Firm* — Fabian VanCott

(57) ABSTRACT

A microfluidic apparatus may include, in an example, a substrate, at least one silicon die embedded into the substrate, and a planarization layer layered over, at least, a portion of the substrate that interfaces with the silicon die to prevent a fluid from contacting an edge of the silicon die.

20 Claims, 4 Drawing Sheets

(56) References Cited

U.S. PATENT DOCUMENTS 9,524,921 B2 12/2016 Kim
2007/0286773 A1 12/2007 Schlautmann
2017/0162540 A1 6/2017 Ji

* cited by examiner

PLANARIZATION LAYERS OVER SILICON DIES

BACKGROUND

Silicon die packaging enabled by fan out wafer level packaging (OF-WLP) is the overmolding of a plurality of silicon dies with, for example, an epoxy mold compound (EMC). The overmolding process allows for the fluidically interconnecting silicon dies in one package to be more cost effective.

BRIEF DESCRIPTION OF THE DRAWINGS

The accompanying drawings illustrate various examples of the principles described herein and are part of the specification. The illustrated examples are given merely for illustration, and do not limit the scope of the claims.

Figure 1:
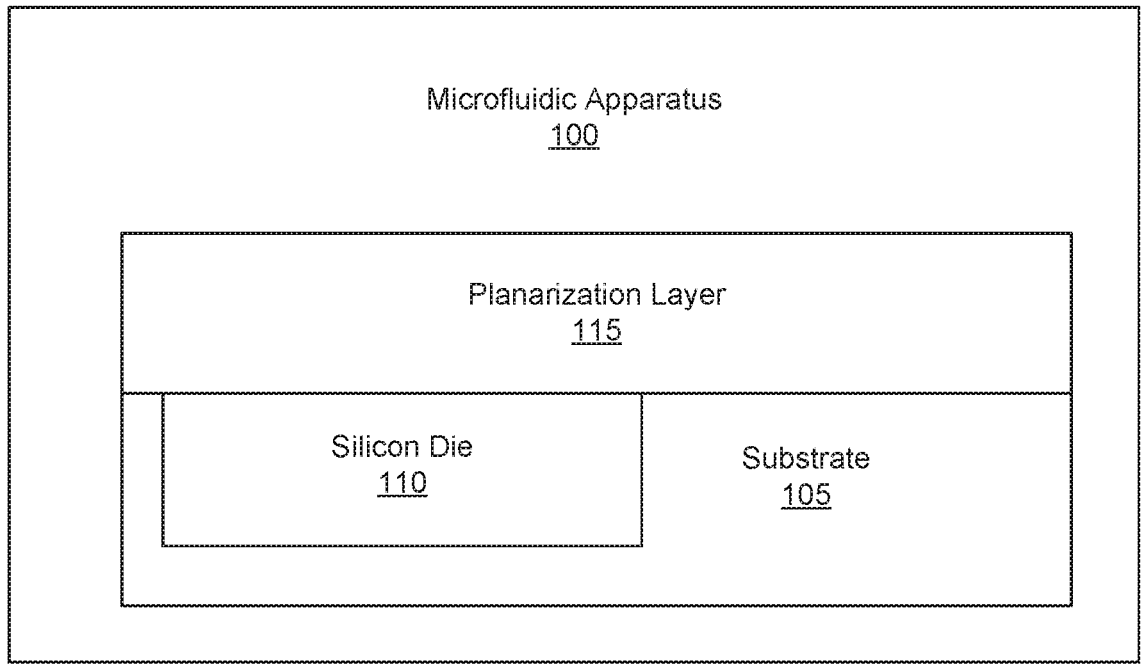
FIG. 1 is a block diagram of a microfluidic apparatus according to an example of the principles described herein.

Throughout the drawings, identical reference numbers designate similar, but not necessarily identical, elements. The figures are not necessarily to scale, and the size of some parts may be exaggerated to more clearly illustrate the example shown. Moreover, the drawings provide examples and/or implementations consistent with the description; however, the description is not limited to the examples and/or implementations provided in the drawings.

DETAILED DESCRIPTION

As described above, an EMC is used to overmold a number of silicon dies. In some examples, additional wafer level manufacturing processes may be done to form a number of channels on the planar wafer formed. Additionally, as a consequence of the overmolding process, the individual silicon dies may be generally co-planar to each other. However, as the number of channels are formed over or plurality of silicon dies, small inconsistencies in the EMC/silicon die interface lead to fluid coming in contact with small ledges (about <20 um) at the silicon die edge and/or non-passivated silicon edges. This may result in functional reliability of the silicon die.

The present specification describes a planarization process and planarized device that passivates any exposed silicon die edges in order to improve the functioning of the silicon die as well as silicon die to silicon die fluid interconnect. The present specification describes a microfluidic apparatus that includes a substrate, at least one silicon die embedded into the substrate, and a planarization layer layered over, at least, a portion of the substrate that interfaces with the silicon die to prevent a fluid from contacting an edge of the silicon die.

The present specification also describes method that includes embedding at least one silicon die into a substrate, laying down a planarization layer over, at least, a portion of the substrate that interfaces with the silicon die to prevent a fluid from contacting an edge of the silicon die.

The present specification further describes a microfluidic device that includes a silicon die embedded into a substrate, a planarization layer layered over, at least, a portion of the substrate that interfaces with the silicon die to prevent a fluid from contacting an edge of the silicon die, and a lid forming a fluidic channel between the silicon die and the lid.

Turning now to the figures, FIG. 1 is a block diagram of a microfluidic apparatus (100) according to an example of the principles described herein. The microfluidic apparatus (100) may include a substrate (105) with at least one silicon die (110) embedded therein. A planarization layer (115) is also included in the microfluidic apparatus (100) and is layered over, at least, a portion of the substrate (105) that interfaces with the silicon die (110).

The microfluidic apparatus (100) may be any type of apparatus that includes features and/or elements that are formed on the micrometer scale. Examples of these features and/or elements include the silicon dies (110) as well as other microfluidic devices, microfluidic channels, and electrical traces, among others. Examples of microfluidic devices include integrated circuits (ICs), thermal inkjet dies, Piezo printhead dies, sensors, actuators, microelectromechanical systems (MEMS), heaters, light-emitting diodes (LEDs), lasers, electrodes, waveguides, lead frames, cooling plates, tubes, antennas, mechanical filters, printed circuit boards (PCBs), molded components, radio-frequency identification (RF ID) tags, lead zirconate titanate (PZT) devices, among others.

The substrate (105) may be any type of substrate (105) into which at least one silicon die (110) may be embedded. In an example, the substrate (105) is epoxy mold compound (EMC). In an example, the substrate (105) is formed into a single layer to embed the silicon die (110) therein.

The silicon die (105) may provide any function as described above within the microfluidic apparatus (100). In an example, the silicon die (110) may itself include microfluidic devices, microfluidic channels, and electrical traces used to perform a myriad of different functions such as ejection of fluids, heating of fluids, analysis of fluids, and pumping of fluids, among other functions. As described above, the silicon die (110) may be proud or recessed relative to an upper surface of the substrate (105). As a consequence, at least, of the silicon die (110) being proud relative to the substrate (105), is that certain portions of the silicon die (110) may be left exposed to contact with a fluidic analyte passing over the silicon die (110).

The microfluidic apparatus (100) further includes a planarization layer (115). The planarization layer (115) may be made of an epoxy-based material, epoxy material, or thick film polymer material such as SU-8. During manufacture of the microfluidic apparatus (100), a thin planarizing layer (115) of SU8, for example, may be applied onto the surface of the substrate (105) and embedded silicon dies (110) as a base layer. Because there exists a number of transition errors between the surface of the substrate (105) and the silicon dies (110), the SU8 planarization layer (115) also planarizes these transition errors. In an example, the thickness of the SU-8 layer is less than 5 microns. In an example, the thickness of between 2 to 5 microns.

During embedding of the silicon dies (110) into the substrate (105), changes in temperature and/or shrinkage of the substrate (105) material may cause trenches to from between the substrate (105) and silicon die (110). Accordingly, fluid may seep into these trenches causing the silicon die (110) to be grounded or otherwise function inappropriately. The planarization layer (115) prevents this from happening by filling in these formed trenches thereby preventing fluid from contacting the sides of the silicon die (110) during operation of the microfluidic apparatus (100). In an example, the planarization layer (115) may be patterned off of each of the silicon dies (110) during manufacture such that a top portion of the silicon die (110) is not layered over with the planarization layer (115). As indicated, because the planarization layer (115) is patterned off of the silicon dies (110), which may create shelfs between the patterned and non-patterned portions of the planarization layer (115). However, because the planarization layer (115) is 2 to 5 microns, the differences in height along the surface of the substrate (105) and silicon dies (110) is not substantial enough to affect the flow of a fluid such as an analyte over the substrate (105) and silicon dies (110). This may be especially so because a microfluidic channel formed over the substrate (105) and silicon dies (110) may have a cross-section of between 100-200 microns. Additionally, the planarization layer (115) being laid down fills in trenches formed between the substrate (105) and silicon dies (110) that may be several tens or even hundreds of microns deep.

The silicon die (110) may include a number of additional layers on top that perform various functions within the microfluidic apparatus (100). These additional layers may include, for example, thin film layers on top the silicon die (110), passivation layers, among other types of layers.

The microfluidic apparatus (100) may further include a lid formed over the substrate (105) and silicon dies (110). The lid may be formed over the substrate (105) and silicon dies (110) such that a microfluidic channel is formed. As described above, the microfluidic channel allows a fluid such as an analyte to pass over the substrate (105) and more particularly the silicon dies (110). This is done such that the silicon dies (110) may access the analyte in order to perform a number of functions according to the type of silicon die (110). By way of example, the silicon dies (110) may analyze the analyte, heat the analyte, cool the analyte, excite the analyte using electromagnetic radiation, pump the analyte, and measure the analyte among other functions depending on the type of silicon dies (110) embedded into the substrate (105).

Figure 2:
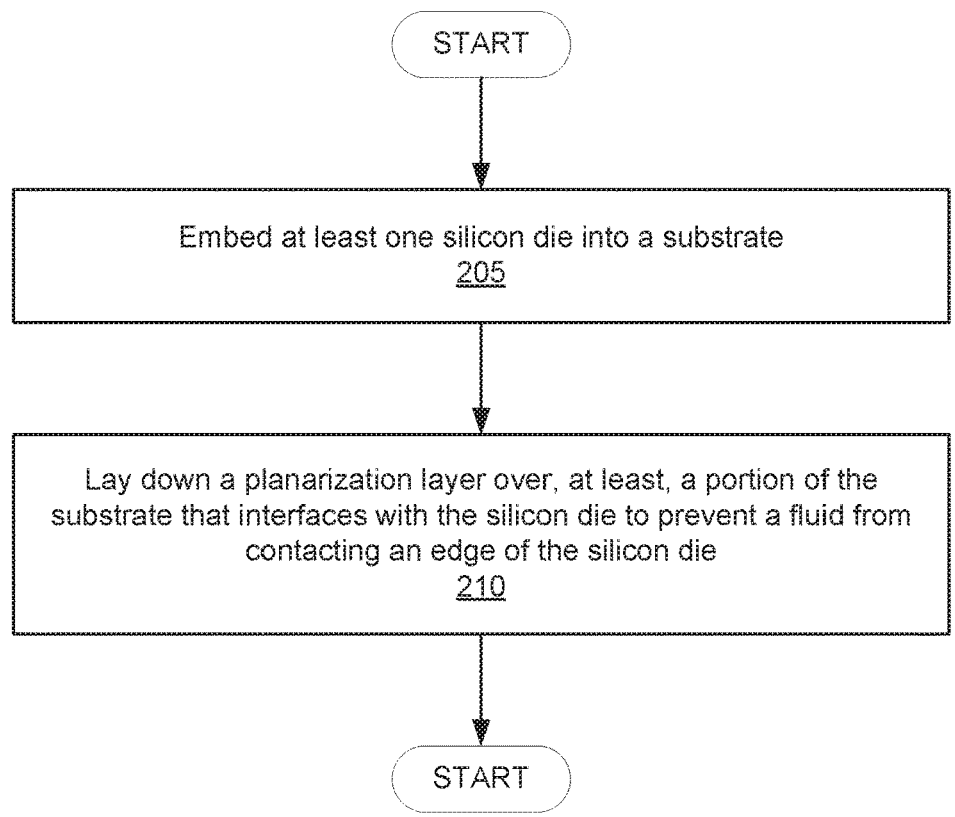
FIG. 2 is a flowchart showing a method of forming the microfluidic apparatus of FIG. 1 according to an example of the principles described herein.

FIG. 2 is a flowchart showing a method of forming the microfluidic apparatus of FIG. 1 according to an example of the principles described herein. The method (200) may begin with embedding (205) at least one silicon die (FIG. 1, 110) into a substrate (FIG. 1, 105). The substrate (FIG. 1, 105) may be any type of substrate (FIG. 1, 105) into which at least one silicon die (FIG. 1, 110) may be embedded. In an example, the substrate (FIG. 1, 105) is epoxy mold compound (EMC). The silicon die (105) may provide any function as described above within the microfluidic apparatus (100). In an example, the silicon die (110) may itself include microfluidic devices, microfluidic channels, and electrical traces used to perform a myriad of different functions such as ejection of fluids, heating of fluids, analysis of fluids, and pumping of fluids, among other functions.

As described above, the silicon die (FIG. 1, 110) may be embedded (205) into the substrate (FIG. 1, 105) but may leave defects in the interface between the substrate (FIG. 1, 105) and the silicon die (FIG. 1, 110). These defects may expose a portion of the side of the silicon die (FIG. 1, 110) such that if a fluid contacts the side of the silicon die (FIG. 1, 110), the performance of the silicon die (FIG. 1, 110) may be compromised.

In order to prevent this, the method (200) may continue with laying down (210) a planarization layer (FIG. 1, 115) over, at least, a portion of the substrate (FIG. 1, 105) that interfaces with the silicon die (FIG. 1, 110) to prevent a fluid from contacting an edge of the silicon die (FIG. 1, 110). The planarization layer (115) may be made of an epoxy-based material, epoxy material, or thick film polymer material such as SU-8. Because there exists a number of transition errors between the surface of the substrate (105) and the silicon dies (110), the SU8 planarization layer (115) also planarizes these transition errors. In an example, the thickness of the SU-8 layer is less than 5 microns. In an example, the thickness of between 2 to 5 microns.

In an example, the method (200) may include patterning the planarization layer (FIG. 1, 115) onto the surface formed by the substrate (FIG. 1, 105) and the silicon dies (FIG. 1, 110). In this example, the planarization layer (FIG. 1, 115) is prevented from covering portions of the silicon dies (FIG. 1, 110). This allows a top surface of the silicon die (FIG. 1, 110) to contact an analyte passing through the microfluidic channel.

The method (200) may further include placing a lid over the substrate (FIG. 1, 105) and silicon dies (FIG. 1, 110). In an example, the lid may be made of a glass, an acrylic, SU8, or any other material that can maintain an analyte in a microfluidic channel formed by the lid and the substrate (FIG. 1, 105)/silicon dies (FIG. 1, 110).

In an example, the method (200) may also include the deposition of a redistribution layer (RDL). The RDL may provide the power and/or signals to and from the silicon dies (FIG. 1, 110) embedded into the substrate (FIG. 1, 105). In an example, the RDL electrically couples the silicon dies (FIG. 1, 110) to a power source separate from the microfluidic apparatus (FIG. 1,100) such as a fluid ejection device that controls the position of the microfluidic apparatus (FIG. 1, 100) over, for example, an assay plate. In this example, the fluid ejection device may control the deposition of the analyte into wells defined in the assay plate after the analyte has passed through the microfluidic channel. In an example, the microfluidic apparatus (100) is a disposable device used once with the fluid ejection device.

Figure 3:
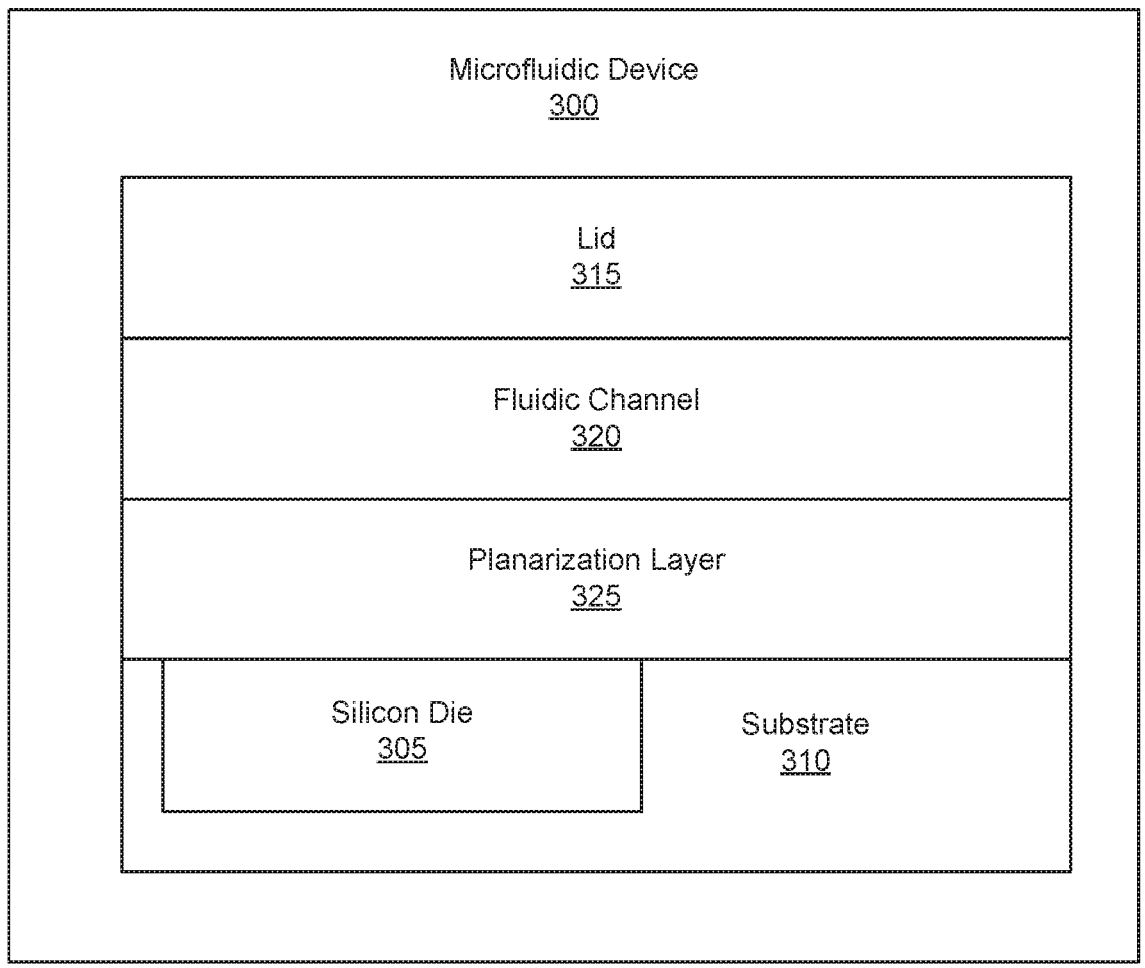
FIG. 3 is a block diagram of a microfluidic device according to an example of the principles described herein.

FIG. 3 is a block diagram of a microfluidic device (300) according to an example of the principles described herein. The microfluidic device (300) may include a silicon die (305) embedded into a substrate (310). Additionally, the microfluidic device (300) may include a planarization layer (325) layered over, at least, a portion of the substrate (310) that interfaces with the silicon die (305) to prevent a fluid from contacting an edge of the silicon die (305). The microfluidic device (300) may further include a lid (315) forming a fluidic channel (320) between the silicon die (305) and the lid (315). The shape of the fluidic channel (320) formed by the lid (315) and the silicon die (305)/substrate (310) may be any shape.

In an example, the silicon die (305) or silicon dies (305) embedded into the substrate (310) may perform certain functions as described herein. In an example where the silicon dies (305) measure the fluidic flow of an analyte through the fluidic channel (320), the shape of the fluidic channel (320) may be predetermined allowing the data obtained from the silicon dies (305) to correctly determine the fluidic flow.

As described herein, the planarization layer (325) prevents fluid from contacting side portions of the silicon dies (305). Preventing fluid from contacting the sides of the silicon dies (305) prevents the silicon die (305) from being grounded or otherwise electrically compromised. Additionally, the planarization layer (325) allows for a relatively better fluidic flow through the fluidic channel (320) and specifically over the silicon dies (305) embedded into the substrate (310). The planarization layer (325) improves fluidic flow by specifically eliminating fluid capillary and routing inconsistencies along an edge transition of the substrate (310) and silicon dies (305). The planarization layer (325) acts as a base layer for improved adhesion of the lid (315) to a portion of the substrate (310). Better adhesion allows for a myriad of different materials that can be used to form the lid (315). Further, because the planarization layer (325) can be patterned, portions of the top surface of the silicon dies (305) may be left exposed to the fluid passing through the fluidic channel (320) and the degree to how much surface area of the silicon dies (305) may be adjusted according to application and/or functions of the silicon dies (305).

Figure 4:
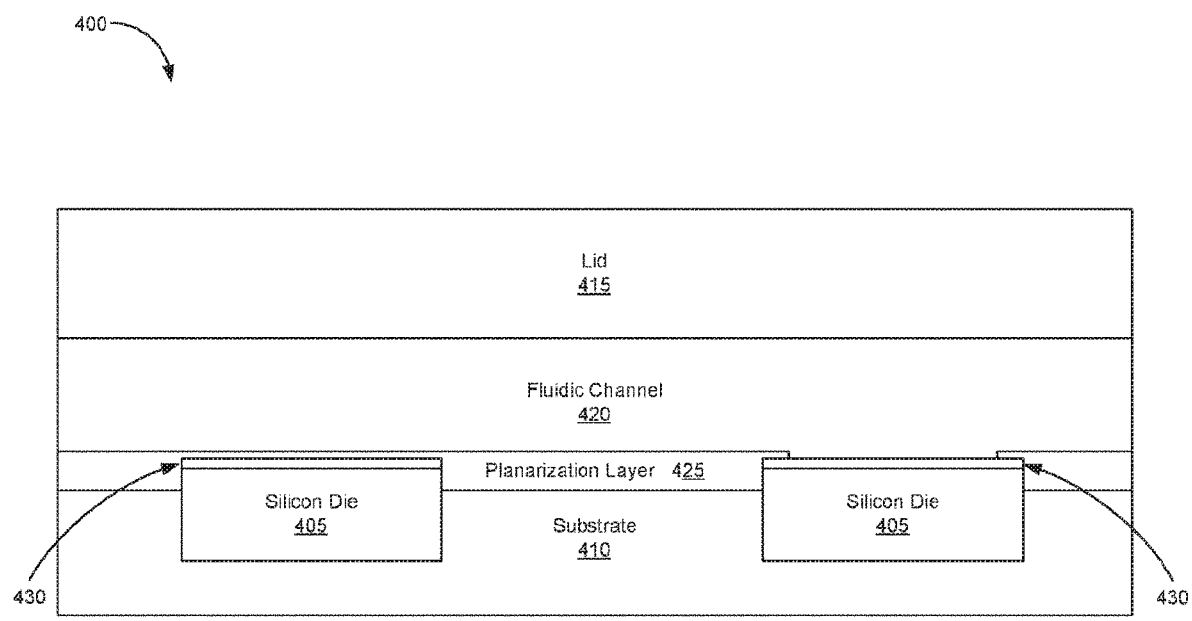
FIG. 4 is a cross-sectional block diagram of a microfluidic device according to an example of the principles described herein.

FIG. 4 is a cross-sectional block diagram of a microfluidic device (400) according to an example of the principles described herein. Similar to FIG. 3, the microfluidic device (400) may include a number of silicon dies (405) embedded into a substrate (410). Additionally, the microfluidic device (400) may include a planarization layer (425) layered over, at least, a portion of the substrate (410) that interfaces with the silicon die (405) to prevent a fluid from contacting an edge of the silicon die (405). The microfluidic device (400) may further include a lid (415) forming a fluidic channel (420) between the silicon die (405) and the lid (415). The shape of the fluidic channel (420) formed by the lid (415) and the silicon die (405)/substrate (410) may be any shape.

As shown in FIG. 4, the planarization layer (425) may, in an example, cover the entirety of the silicon dies (405). In this example, the silicon dies (405) that are completely covered may provide functions to the microfluidic device (400) where contact with the fluid flowing through the fluidic channel (420) does not prevent the silicon dies (405) from affecting the analyte or otherwise function. In an example, the planarization layer (425) may be patterned over the silicon dies (405) such that at least a portion of the silicon dies (405) are not covered with the planarization layer (425). In this example, the silicon dies (405) come in direct contact with the fluid flowing through the fluidic channel (420) in order to affect the analyte directly as dictated by their functionality.

As mentioned herein, the silicon dies (405) may also include an additional layer (430) over the silicon dies (405). In an example, the additional layer (430) may include an RDL, thin film layers on top the silicon die (410), passivation layers, among other types of layers. These layers, during manufacture of the microfluidic device (400) may also be covered, partially, by the planarization layer (425) in order to prevent the fluid flowing through the fluidic channel (420) from touching the sides of the silicon dies (405).

The specification and figures describe a microfluidic apparatus, device, and method of making the apparatus and device. The planarization layer described herein prevents fluid from contacting side portions of the silicon dies that have been embedded into a substrate. Preventing fluid from contacting the sides of the silicon dies prevents the silicon die from being grounded or otherwise electrically compromised, Additionally, the planarization layer allows for a relatively better fluidic flow through the fluidic channel and specifically over the silicon dies embedded into the substrate. The planarization layer improves fluidic flow by specifically eliminating fluid capillary and routing inconsistencies along an edge transition of the substrate and silicon dies.

In an example, the planarization layer may act as a base layer for improved adhesion of a lid to a portion of the substrate. Better adhesion may allow for a myriad of different materials to be used to form the lid. Further, because the planarization layer can be patterned, portions of the top surface of the silicon dies may be left exposed to the fluid passing through the fluidic channel and the degree to how much surface area of the silicon dies may be adjusted according to application and/or functions of the silicon dies.

The preceding description has been presented to illustrate and describe examples of the principles described. This description is not intended to be exhaustive or to limit these principles to any precise form disclosed. Many modifications and variations are possible in light of the above teaching.

What is claimed is:

1. A microfluidic apparatus, comprising:
a substrate;
at least one silicon die embedded into the substrate; and
a planarization layer layered over, at least, a portion of the substrate that interfaces with the silicon die to prevent a fluid from contacting an edge of the silicon die.

2. The microfluidic apparatus of claim 1, wherein the substrate is epoxy mold compound (EMC).

3. The microfluidic apparatus of claim 1, wherein the planarization layer is SU8.

4. The microfluidic apparatus of claim 1, wherein the planarization layer planarizes a surface created by the embedded silicon die and the substrate.

5. The microfluidic apparatus of claim 1, further comprising a lid placed over the substrate and silicon die to form a microfluidic channel between the lid and a surface created by the substrate and silicon die.

6. The microfluidic apparatus of claim 1, wherein the planarization layer is 2-5 microns thick.

7. The microfluidic apparatus of claim 1, further comprising a redistribution layer wherein the redistribution layer is, at least, partially covered by the planarization layer.

8. A method, comprising:
embedding at least one silicon die into a substrate;
laying down a planarization layer over, at least, a portion of the substrate that interfaces with the silicon die to prevent a fluid from contacting an edge of the silicon die.

9. The method of claim 8, further comprising forming a lid over the embedded silicon die to form a fluid channel between the lid and the silicon die.

10. The method of claim 9, further comprising removing a portion of the planarization layer formed over the silicon die to expose the silicon die to the fluid channel.

11. The method of claim 9, further comprising planarizing the planarization layer to provide a uniform planarization layer within the fluid channel.

12. The method of claim 8, wherein the planarization layer is 2-5 microns thick.

13. A microfluidic device, comprising:
a silicon die embedded into a substrate;
a planarization layer layered over, at least, a portion of the substrate that interfaces with the silicon die to prevent a fluid from contacting an edge of the silicon die; and
a lid forming a fluidic channel between the silicon die and the lid.

14. The microfluidic device of claim 13, further comprising a redistribution layer wherein the redistribution layer is, at least, partially covered by the planarization layer.

15. The microfluidic device of claim 13, wherein the planarization layer is SU8.

16. The microfluidic apparatus of claim 1, wherein the planarization layer fills gaps between vertical sides of the at least one silicon die and the substrate in which the at least one silicon die is embedded.

17. The microfluidic apparatus of claim 1, wherein the planarization layer is patterned to leave exposed at least a portion of an upper surface of the at least one silicon die while covering portions of the substrate surrounding the at least one silicon die.

18. The microfluidic apparatus of claim 1, wherein the silicon die comprises a microfluidic device.

19. The microfluidic apparatus of claim 5, wherein the lid is made of glass, acrylic or SU8.

20. The microfluidic apparatus of claim 1, further comprising a Redistribution Layer (RDL) to provide power or data signals to the at least one silicon die embedded in the substrate.

* * * * *